(12) United States Patent
Lee et al.

(10) Patent No.: US 9,257,317 B2
(45) Date of Patent: Feb. 9, 2016

(54) OVERHEAD HOIST TRANSPORT SYSTEM

(71) Applicant: INOTERA MEMORIES, INC., Taoyuan (TW)

(72) Inventors: Chi-Ming Lee, Yilan County (TW); Tsan-I Chen, Taoyuan County (TW)

(73) Assignee: INOTERA MEMORIES, INC., Hwa-Ya Technology Park Kueishan, Taoyuan (TW)

( * ) Notice: Subject to any disclaimer, the term of this patent is extended or adjusted under 35 U.S.C. 154(b) by 51 days.

(21) Appl. No.: 14/144,560

(22) Filed: Dec. 31, 2013

(65) Prior Publication Data

US 2015/0104276 A1 Apr. 16, 2015

(30) Foreign Application Priority Data

Oct. 15, 2013 (TW) .............................. 102137195 A

(51) Int. Cl.
*B65H 1/00* (2006.01)
*H01L 21/677* (2006.01)
*H01L 21/673* (2006.01)

(52) U.S. Cl.
CPC ...... *H01L 21/67733* (2013.01); *H01L 21/6735* (2013.01)

(58) Field of Classification Search
CPC ................... H01L 21/67733; H01L 21/6735; B66C 19/00; B66C 13/00; B23Q 7/04
USPC ................................................... 414/626, 940
See application file for complete search history.

(56) References Cited

U.S. PATENT DOCUMENTS

| | | | |
|---|---|---|---|
| 6,453,574 B1 | 9/2002 | Chen | |
| 7,578,650 B2 * | 8/2009 | Aalund et al. | ............... 414/806 |
| 2002/0197136 A1 * | 12/2002 | Huang et al. | ................. 414/217 |
| 2003/0235486 A1 * | 12/2003 | Doherty et al. | ........... 414/217.1 |
| 2005/0008467 A1 * | 1/2005 | Huang et al. | ................. 414/626 |
| 2005/0079041 A1 * | 4/2005 | Campbell et al. | ............ 414/626 |
| 2005/0118938 A1 * | 6/2005 | Mizomoto et al. | ............. 451/65 |
| 2007/0128010 A1 * | 6/2007 | Gifford et al. | ............... 414/281 |
| 2009/0218401 A1 * | 9/2009 | Moran et al. | ................. 235/439 |

FOREIGN PATENT DOCUMENTS

| | | |
|---|---|---|
| TW | I272665 | 2/2007 |
| TW | I286989 | 9/2007 |
| TW | M319803 | 10/2007 |
| TW | 200821241 | 5/2008 |

* cited by examiner

*Primary Examiner* — Stephen Vu
(74) *Attorney, Agent, or Firm* — Winston Hsu; Scott Margo

(57) ABSTRACT

The present invention provides an overhead hoist transport system, which includes a rail, a stocker disposed under the rails, wherein the stocker can move along the direction of the rail, and a cleaning station, disposed on the rail to clean the stocker directly when the stocker is moving.

4 Claims, 3 Drawing Sheets

OVERHEAD HOIST TRANSPORT SYSTEM

BACKGROUND OF THE INVENTION

1. Field of the Invention

The present invention relates to semiconductor manufacturing process technologies, in particular, to an overhead hoist transport system.

2. Description of the Prior Art

In the manufacturing process for forming a semiconductor device, the wafer is an important substrate material. In order to decrease the possibility of the waters being damaged when the wafers are transported, the overhead hoist transport (OHT) system is usually to be used for transporting the wafers. The overhead hoist transport system is not only smooth, but also the transportation time can be precisely controlled, thereby enhancing the stability of the wafer transporting effectively.

However, the conventional overhead hoist transport system mainly comprises a rail and a stocker with wheels, and the stocker is moving along the rail through the wheels. Since the wheels directly contact the rail, some particles and dust will be formed during the rubbing between the wheels and the rail, and these particles most likely to drop down on the top surface of the stocker. If the positioning sensor chip is covered by these particles, the position system of the stocker will be affected, may even increase the possibility of the overhead hoist transport system shut down, and this will require more labor to be spent to correct the overhead hoist transport system malfunction.

Therefore, the applicant provides an overhead hoist transport system, which can effectively reduce the shutting down possibility of overhead hoist transport systems occurring when particles drop down.

SUMMARY OF THE INVENTION

To achieve the purpose mentioned above, the present invention provides an overhead hoist transport system, which includes a rail, a stocker disposed under the rails, wherein the stocker can move along the direction of the rail, and a cleaning station, disposed on the rail to clean the stocker directly when the stocker is moving.

The present invention further comprises a cleaning station, and when the stocker is moving or stopping on the rail, the cleaning station cleans the top surface of the stocker directly. Therefore the particles or the dust accumulated on the top surface of the stocker can be easily cleaned. Requiring only a small cost, the shutting down possibility of the overhead hoist transport system caused by the particles dropping down can be effectively reduced, which thereby increases the stability and the yield of the overhead hoist transport system.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
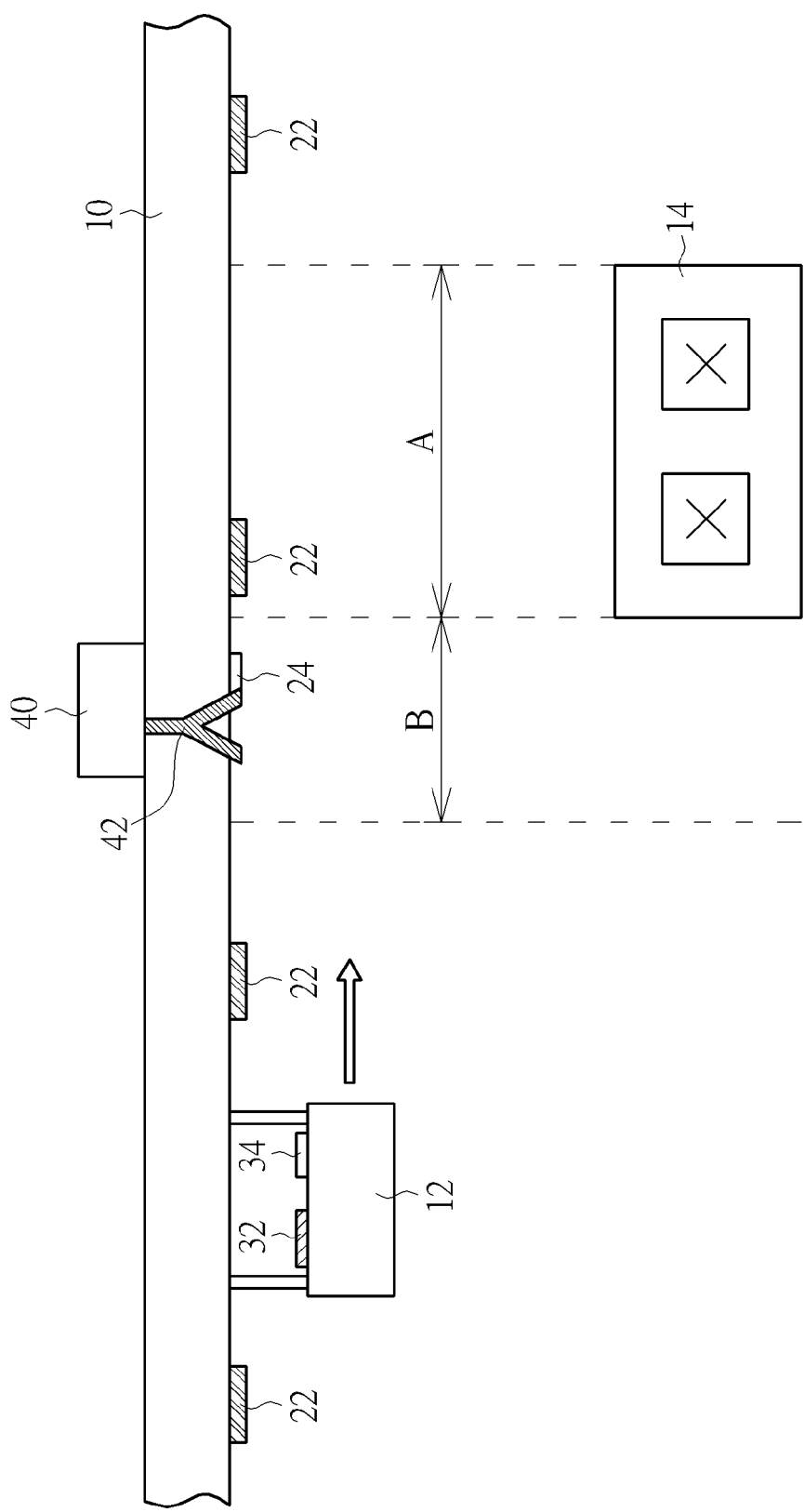
FIG. 1 is a schematic diagram showing the overhead hoist transport system of the present invention.
Figure 2:
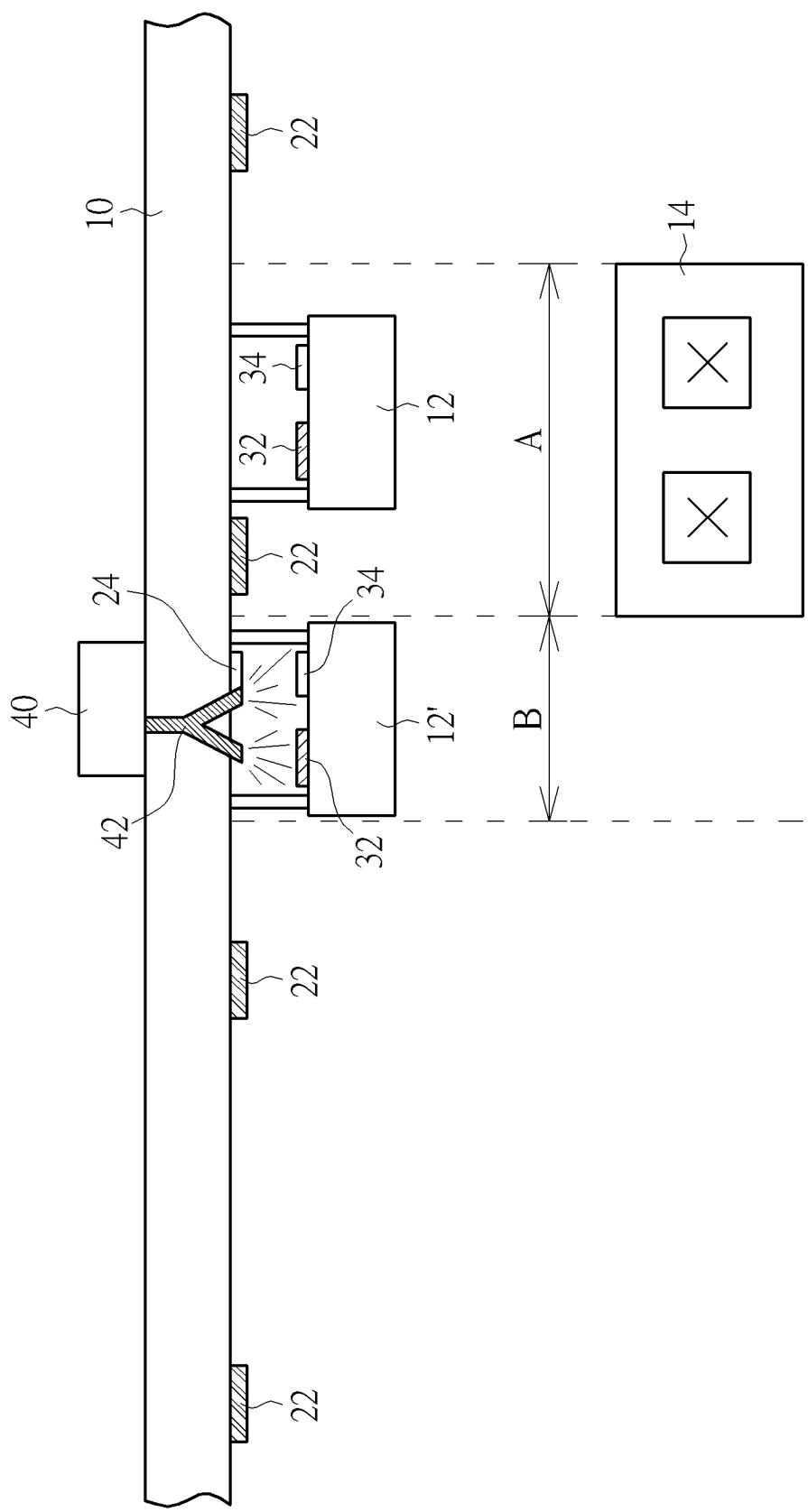
FIG. 2 is a schematic diagram showing the overhead hoist transport system of the present invention.

Please refer to FIGS. 1-2, which are schematic diagrams showing an overhead hoist transport system of the present invention. In order to simplify the diagrams, FIGS. 1-2 only show a partial structure of overhead hoist transport system. As shown in FIG. 1, the overhead hoist transport system of the present invention includes a rail 10, a stocker 12 disposed under the rail 10, where the stocker 12 can move forward or move backward along the direction of the rail 10. The stocker 12 includes at least one wheel (not shown), the wheel directly contacting the rail 10, a FOUP loading region A, a hosting platform 14 disposed within the FOUP loading region A, and a FOUP (Front Opening Unified Pod, which is designed to hold wafers securely and safely in a controlled environment, not shown in FIG. 1) disposed on the hosting platform 14, and at least one wafer loaded in the FOUP. Generally, when the stocker 12 is moving on the rail 10, the stocker 12 will be paused when passing by the FOUP loading region A, and the FOUP will be loaded, unloaded or exchanged through the hosting platform 14, to transport the wafers. It is worth noting that even though the stocker 12 in this embodiment is used for transporting the FOUPs, but the present invention is not limited thereto. The stocker of the present invention may be used for transporting any materials, components or semi-finished products or products.

In addition, in order to precisely locate the position of the stocker on the rail, to facilitate controlling the moving or pausing of the stocker, the overhead hoist transport system of the present invention includes a positioning system. The positioning system at least comprises the sensors installed on the top surface of the stocker 12 and under the rail 10. The sensors may include signal transmitters or signal receivers. More precisely, referring to FIG. 2, when the stocker 12 is moving along the rail 10, another stocker sorted behind (such as the stocker 12' in FIG. 2) will be moving along the same track. In order to locate the position of each stocker, the overhead hoist transport system of the present invention further comprises a plurality of positioning barcodes 22 disposed under the rail 10 and arranged in intervals. Besides, at least one barcode reader chip 32 is disposed on the top surface of each stocker (including the stocker 12, the stocker 12' and any others stocker not shown in the figure). When the stockers move on the rail 10, every time each positioning barcode 22 passes by the barcode reader chip 32 disposed on the stocker will read the values of the positioning barcode 22, and transmit the values back to the system. Since each positioning barcode 22 includes different values, by reading the values of the positioning barcodes 22 through the barcode reader chips 32, the relative position of each of the stocker can be roughly known. In addition, when the overhead hoist transport system is operating, each stocker (such as the stocker 12) should be paused within the FOUP loading region A for a while, to load, unload or exchange the FOUP, and others stockers sorted behind (such as the stocker 12') should be paused within a preparation region B, wait for the stocker 12 operation to be finished, and then move in sequence to the FOUP loading region A operation.

In order to make the stocker 12' pause in the preparation region B precisely, the a positioning device 24 is disposed under the rail 10 within the preparation region B, and a positioning sensor chip 34 is disposed on the top surface of each stocker (including the stocker 12, the stocker 12' and any others stocker not shown in the figure). When the stocker enters in the preparation region B, the positioning sensor chip 34 will receive the signals emitted from the positioning device 24, the stocker will be paused within the preparation region B, waiting for the stocker in front of itself finishes the operations, and the stock will keep moving by the controlling of the system. It is worth noting that in this embodiment, the positioning device 24 may be a signal transmitter, and the positioning sensor chip 34 may be a signal receiver, but the present invention is not limited thereto. In other words, the positioning device 24 may be a signal receiver, and the positioning sensor chip 34 may be a signal transmitter, and this should be comprised in the scope of the present invention.

Figure 3:
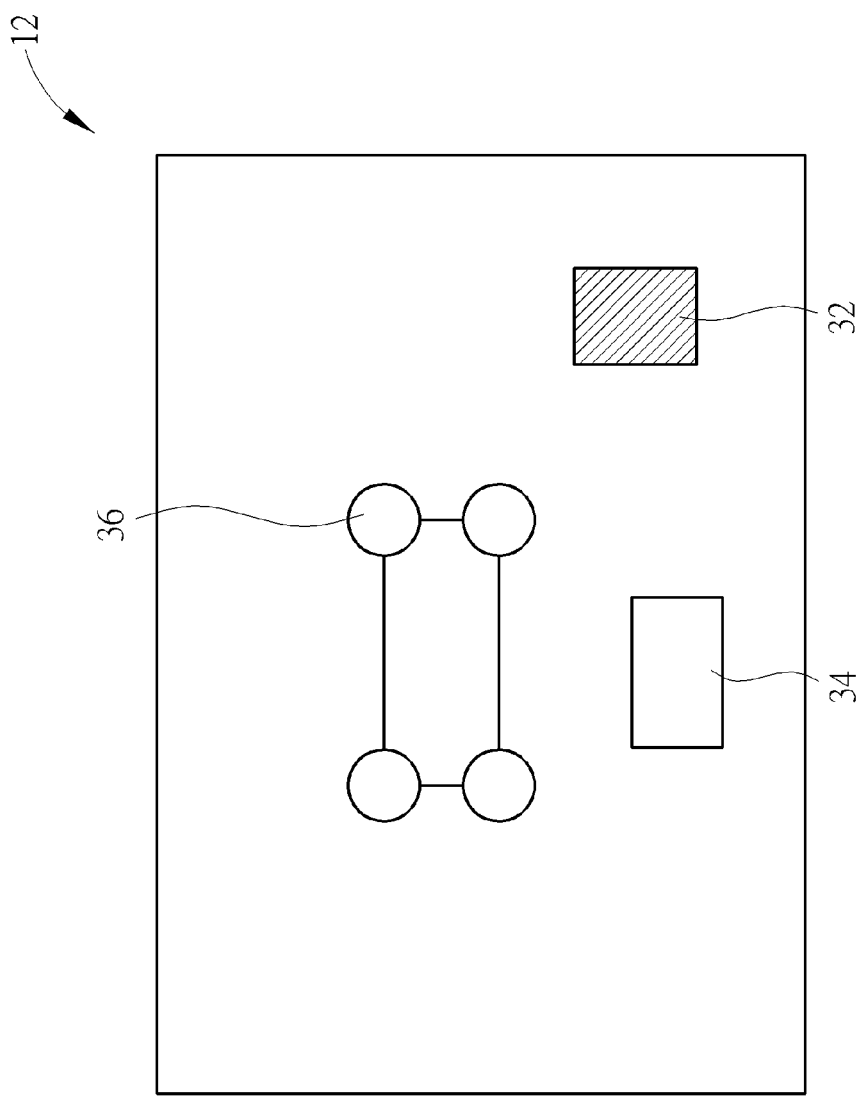
FIG. 3 is a top view diagram showing the overhead hoist transport system of the present invention.

Please refer to FIG. 3, which is a top view diagram showing the stock of the present invention. The stocker 12 of the present invention has a plurality of wheels 36 on the top surface of the stocker 12 (taking the stocker 12 as an example, but other stockers of the present invention are applicable too) since the wheels 36 directly contact the rail 10. Therefore when the stocker 12 moving, the wheels 36 on the stocker 12 will rub against the rail 10, and form some particles or dust. If these particles drop down on the stocker 12, especially hiding the barcode reader chip 32 or the positioning sensor chip 34 on the stocker 12, the signal transmitting or receiving of the barcode reader chip 32 or the positioning sensor chip 34 may be influenced, thereby affecting the moving and pausing of the stocker 12 controlled by the system. Furthermore, the overhead hoist transport system may shut down. The applicant found that on average, the conventional overhead hoist transport system may shut down about 4 times caused by the particles dropping down in one day, and the recovery time is about 10 minutes. In other words, under a long operating time, the average yield of the overhead hoist transport system will be significantly affected by the falling particles.

To resolve the issues mentioned above, the overhead hoist transport system of the present invention further comprises a cleaning station. Please refer to FIGS. 1-2. A cleaning station 40 is disposed above the rail 10. In this embodiment, the cleaning station 40 may comprises a compressed air machine, which includes a jet pipe 42, disposed within the preparation region B, but not limited thereto. When the positioning sensor chip 34 on the stocker 12 and the positioning device 24 within the preparation region B detect each other, the stocker 12 will be paused within the preparation region B. At this time, the system may send a signal to the cleaning station 40, to control the cleaning station 40 to jet air through the jet pipe 42, and to clean the stocker 12. In this embodiment, the cleaning station 40 cleans the stocker 12, in particular, to cleanup the dust or the particles accumulated on the top surface of the stocker 12. The jetted air through the jet pipe 42 comprises compressed air, nitrogen or other gases. In addition, in this embodiment, the cleaning station 40 is disposed within the preparation region B. Therefore when the stocker 12 is waiting in the preparation region B, the stocker can be cleaned. But it is worth noting that the present invention is not limited thereto. In other words, the cleaning station 40 may disposed on any part of the rail 10 out of the preparation region B, and this should be comprised in the scope of the present invention.

The overhead hoist transport system of the present invention is not limited to transporting the FOUPs, and any overhead hoist transport system comprises rails and stockers with wheels, should be comprised in the scope of the present invention. Since the wheel directly contacts the rail, and forms some dust and particles falling down, therefore the feature of the present invention is that the invention further comprises a cleaning station. When the stocker is moving or stopping on the rail, the cleaning station cleans the top surface of the stocker directly, therefore the particles or the dust accumulated on the top surface of the stocker can be easily cleaned. While only requiring a little cost, the shutting down possibility of the overhead hoist transport system caused by the particles dropping down can be effectively reduced, and furthermore increases the stability and the yield of the overhead hoist transport system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An overhead hoist transport system, comprising:
a rail;
a plurality of positioning barcodes disposed on the rail and arranged in intervals;
a stocker, disposed under the rail, moving along a direction of the rail;
at least one positioning device disposed within a preparation region;
at least one positioning sensor chip and at least one barcode reader chip disposed on the stocker; and
a cleaning station, disposed on the rail, cleaning the moving stocker under the rail, wherein the cleaning station at least cleans the positioning sensor chip and the barcode reader chip.

2. The overhead hoist transport system of claim 1, wherein the cleaning station comprises a compressed air machine.

3. The overhead hoist transport system of claim 1, wherein the cleaning station disposed on the rail within the preparation region.

4. The overhead hoist transport system of claim 1, when the stocker enters within the preparation region, the stocker will be paused, and the cleaning station cleans the stocker.

* * * * *